(12) United States Patent
Tanaka et al.

(10) Patent No.: US 8,303,785 B2
(45) Date of Patent: Nov. 6, 2012

(54) PLASMA PROCESSING APPARATUS AND ELECTRONIC DEVICE MANUFACTURING METHOD

(75) Inventors: Yoh Tanaka, Fuchu (JP); Kazuya Konaga, Fuchu (JP); Eisaku Watanabe, Komae (JP); Eitaro Morimoto, Kunitachi (JP)

(73) Assignee: Canon Anelva Corporation, Kawasaki-shi (JP)

( * ) Notice: Subject to any disclaimer, the term of this patent is extended or adjusted under 35 U.S.C. 154(b) by 199 days.

(21) Appl. No.: 12/979,968

(22) Filed: Dec. 28, 2010

(65) Prior Publication Data
US 2011/0089023 A1 Apr. 21, 2011

(30) Foreign Application Priority Data
Jul. 31, 2008 (JP) ................................. 2008-197582

(51) Int. Cl.
*C23C 14/34* (2006.01)
(52) U.S. Cl. .............................. 204/298.11; 204/192.12
(58) Field of Classification Search ............. 204/192.12, 204/298.11
See application file for complete search history.

(56) References Cited

U.S. PATENT DOCUMENTS
2009/0283976 A1 11/2009 Kaneko et al.
2010/0284121 A1 11/2010 Aruga et al.
2010/0294656 A1 11/2010 Ikeda et al.

FOREIGN PATENT DOCUMENTS
| JP | 6-196476 A | 7/1994 |
| JP | 7-126832 A | 5/1995 |
| JP | 10-64850 A | 3/1998 |
| JP | 2002-356771 A | 12/2002 |
| JP | 2004-18885 A | 1/2004 |

*Primary Examiner* — Rodney McDonald
(74) *Attorney, Agent, or Firm* — Fitzpatrick, Cella, Harper & Scinto

(57) ABSTRACT

A plasma processing apparatus includes a chamber, substrate stage, electrode, conductive members, and deposition shield. The chamber is maintained at a predetermined potential. The substrate stage serves to hold a substrate within the chamber. The electrode serves to generate a plasma inside the chamber by applying AC power to the chamber. The conductive members connect the substrate stage and the side wall of the chamber by surrounding the plasma space between the substrate stage and the electrode in plasma formation, and at least some of them are separated by being moved by a driving mechanism so as to form an opening for loading a substrate onto the substrate stage while no plasma is being formed. The deposition shield covers the surfaces of the conductive members on the side of the plasma space.

7 Claims, 4 Drawing Sheets

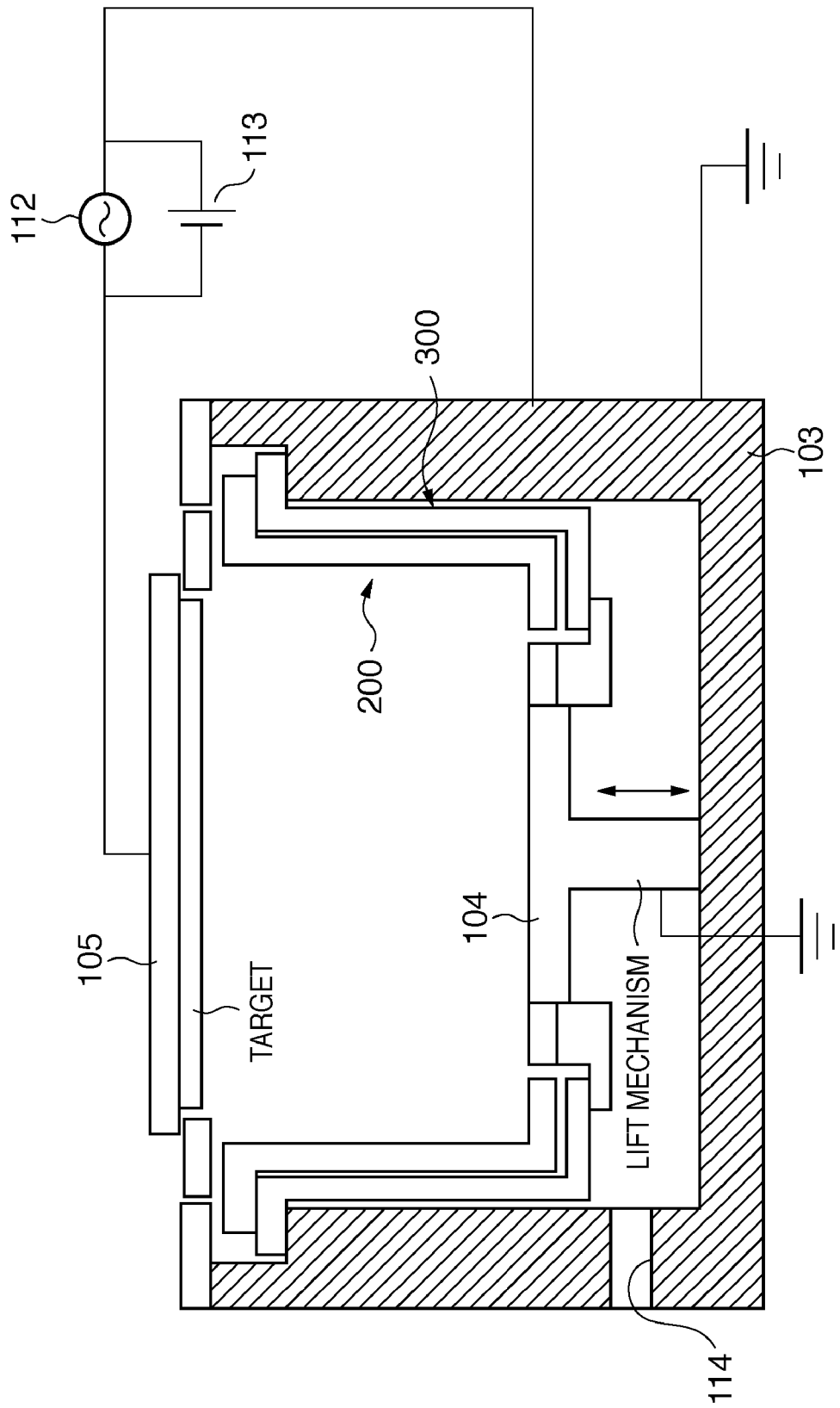

PLASMA PROCESSING APPARATUS AND ELECTRONIC DEVICE MANUFACTURING METHOD

CROSS-REFERENCE TO RELATED APPLICATION

This application is a continuation of International Application No. PCT/JP2009/003612, filed Jul. 30, 2009, which claims the benefit of Japanese Patent Application No. 2008-197582, filed Jul. 31, 2008. The contents of the aforementioned applications are incorporated herein by reference in their entirety.

TECHNICAL FIELD

The present invention relates to a plasma processing apparatus including a chamber which accommodates a deposition shield, and an electronic device manufacturing method.

BACKGROUND ART

Conventionally, a plasma processing apparatus such as a sputtering apparatus includes a vacuum chamber which accommodates a deposition shield that surrounds the plasma generation space so as to prevent sputtered particles and other particles from adhering onto the inner wall of the vacuum chamber and shield the plasma generation space against these particles. Patent reference 1 discloses an example of a sputtering apparatus including a conductive deposition shield.

As shown in patent reference 1, a deposition shield is divided and formed to be openable/closable so as to load a substrate onto a substrate stage at the time of substrate loading. If the deposition shield is completely closed in the division portions after the substrate loading, the film which has adhered onto the surface of the deposition shield peels off due to, e.g., vibration upon opening/closing, thus generating particles. To prevent this, the division portions are maintained in a noncontact state with gaps (1 mm or less) between them, that are narrow enough not to leak the plasma.

CITATION LIST

Patent Literature

Patent reference 1: Japanese Patent Laid-Open No. 2002-356771

SUMMARY OF INVENTION

Technical Problem

However, when a deposition shield is repeatedly used in a process chamber, the adhering film deposits on its shield surface. For this reason, as the amount of deposition increases, the conductive deposition shield is replaced. Nevertheless, because discharge is also performed between the discharge electrode and the conductive deposition shield, the discharge characteristics change when the dimension and shape of the deposition shield differ before and after the replacement. This problem is especially serious in high-frequency discharge. In this case, a current is conducted even to the gaps, so the adverse effect of changes in the above-mentioned gaps due to a change in dimension of the deposition shield is non-negligible; the plasma generation state or the substrate stage potential state changes before and after the replacement or differ for each position. As a result, deposition which uses, for example, sputtering leads to variations in the deposition results such as the film thickness and composition.

Solution to Problem

The present invention has been made in consideration of the above-mentioned problems, and has as its object to provide a plasma processing apparatus which can obtain stable deposition results even when a deposition shield is replaced.

In order to achieve the above-mentioned object, according to the present invention, there is provided a plasma processing apparatus comprising:
a chamber;
a substrate stage configured to hold a substrate within the chamber;
an electrode configured to generate a plasma inside the chamber; and
a shield member formed to surround a plasma space between the electrode and the substrate stage,
wherein the shielding member comprising:
a main body part; and
a separated part formed by dividing the main body part,
wherein the main body part and the separated part each including an inner portion and an outer portion positioned outside the inner portion with respect to the plasma space,
the outer portions of the main body part and the separated portions are conductive members and are formed to be able to connect the chamber and the substrate stage through contact with each other, and
the inner portions of the main part and the separated part are formed so as not to be in contact with each other.

Advantageous Effects of Invention

According to the present invention, it is possible to provide a plasma processing apparatus which can obtain stable deposition results even when a deposition shield is replaced.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 4 is a view showing another embodiment of the sputtering apparatus shown in FIG. 1.

DESCRIPTION OF EMBODIMENTS

An embodiment of the present invention will be described below with reference to the accompanying drawings.

Figure 1:
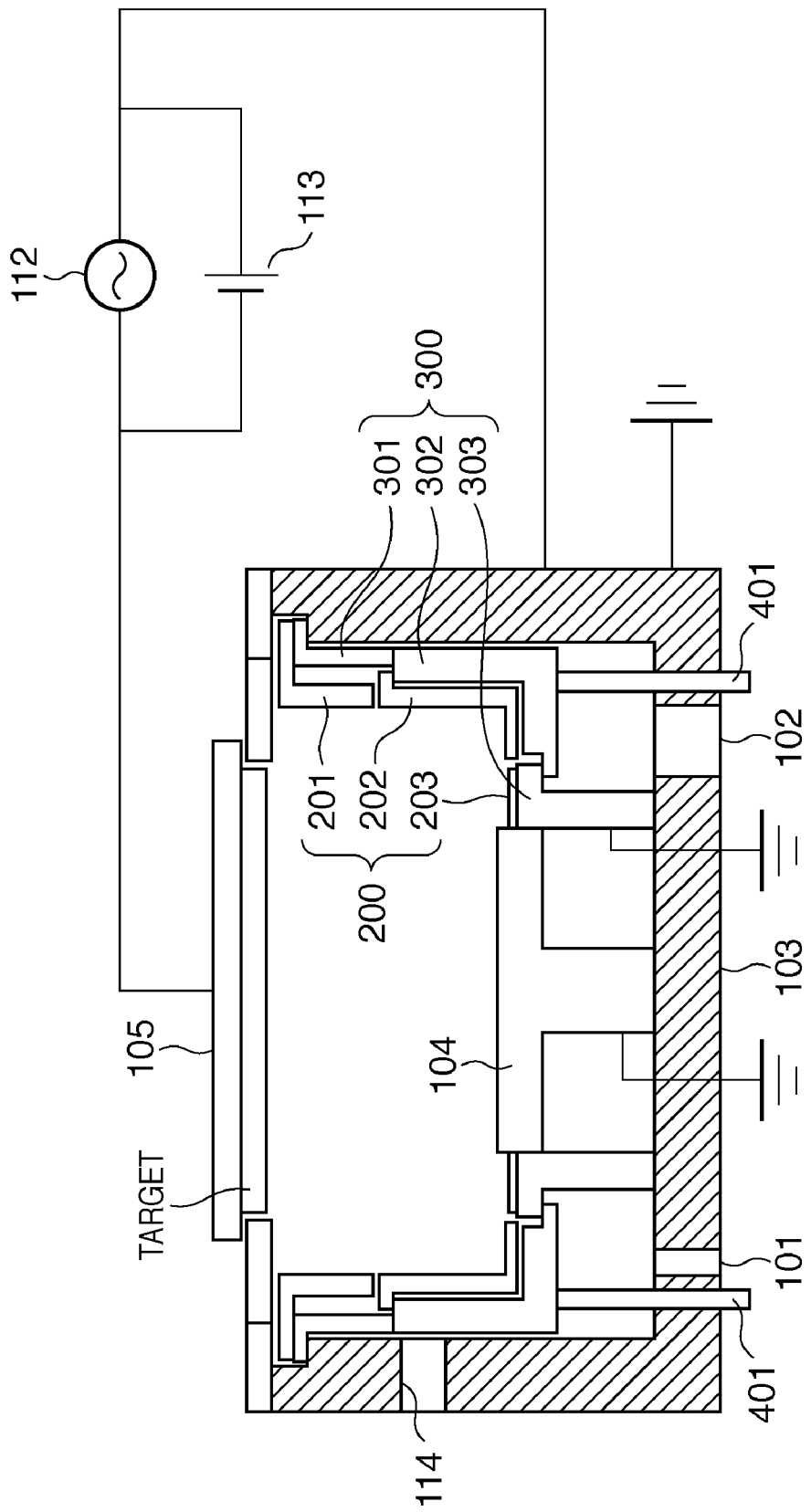
FIG. 1 is a view showing the schematic arrangement of a sputtering apparatus according to one embodiment of the present invention.

In this embodiment, a capacity coupling type sputtering apparatus will be explained as one example of plasma processing apparatuses. FIG. 1 is a view showing the schematic arrangement of a sputtering apparatus according to one embodiment of the present invention.

The sputtering apparatus shown in FIG. 1 includes a vacuum chamber 103 in which a supply hole 101 connected to a gas introduction system for, e.g., a discharge gas and a process gas, and an exhaust hole 102 connected to an exhaust system including a roughing pump and a main pump are formed. The vacuum chamber 103 includes a transport port 114 serving as an opening for loading a substrate to be processed into the vacuum chamber 103 and unloading the processed substrate from the vacuum chamber 103. This embodiment exemplifies a cluster type plasma processing apparatus which is connected to a substrate transport chamber including a substrate transport robot and exchanges a substrate with the robot in the substrate transport chamber. Note that the vacuum chamber 103 is formed in a roughly cylindrical shape.

The vacuum chamber 103 accommodates a stage 104 which can mount a substrate that undergoes a deposition process, and a target electrode 105 which faces the substrate. The target electrode 105 is connected to a DC power supply 113 which generates a DC voltage, and an AC power supply 112 which generates high-frequency power (AC power). The DC power and AC power supplied from these power supplies into the vacuum chamber 103 produce a plasma from the discharge gas introduced into the vacuum chamber 103. The vacuum chamber 103 also accommodates a shield member which surrounds a plasma space formed between the target electrode 105 and the stage 104. The shield member includes a deposition shield 200 (corresponding to an inner portion), and an outer member 300 (corresponding to an outer portion) which surrounds the exterior of the deposition shield 200.

The deposition shield 200 in this embodiment has a roughly cylindrical cross-section as a whole and is divided into three parts in the height direction. The deposition shield 200 includes an upper deposition shield part 201, middle deposition shield part 202, and lower deposition shield part 203. The upper deposition shield part 201, middle deposition shield part 202, and lower deposition shield part 203 (to be also simply referred to as the "deposition shield parts 201 to 203" hereinafter) are configured to integrally surround the plasma space within the vacuum chamber 103. The deposition shield parts 201 to 203 are made of a conductive member such as stainless steel or aluminum. The shield surfaces of the deposition shield parts 201 to 203 exposed to the plasma space side within the vacuum chamber 103 have fine three-dimensional patterns formed on them by Al spraying or blasting in order to prevent peel-off of the sputtered thin films which have adhered onto the shield surfaces once.

Figure 2:
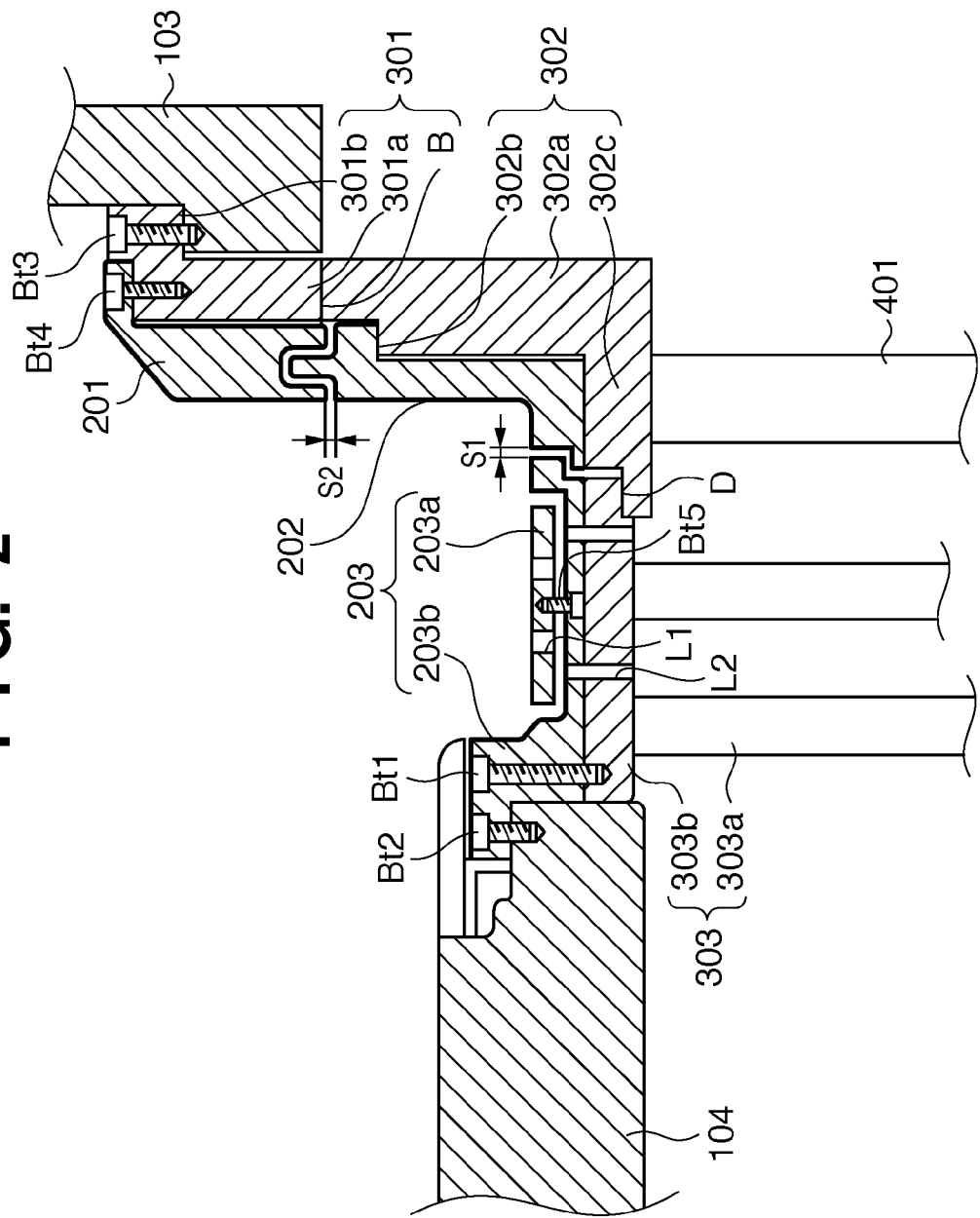
FIG. 2 is an enlarged view of a deposition shield and outer member shown in FIG. 1.

FIG. 2 is an enlarged view of the deposition shield parts 201 to 203 and outer member 300 shown in FIG. 1.

The ranges, in which the fine three-dimensional patterns are formed, on the shield surfaces of the deposition shield parts 201 to 203 are indicated by bold lines in FIG. 2. The deposition shield parts 201 to 203 are spaced apart from each other with gaps S1 and S2 between them so as not to be in contact with each other to prevent them from colliding with each other upon an opening/closing operation (to be described later). The gaps S1 and S2 are preferably about 1.5 to 3 mm. In this case, it is possible to reduce the adverse effect of current conduction across the gaps S1 and S2 and to effectively prevent the sputtered particles from adhering onto the outer member 300.

In this embodiment, the gaps S1 and S2 are formed in a labyrinth shape so as to prevent the sputtered particles from readily moving outside the deposition shield 200 via the gaps S1 and S2. This makes it possible to increase the length of the path from one end of each of the gaps S1 and 52 to the other end of each of the gaps S1 and S2 and, in turn, to reduce the possibility that the particles reach outside the deposition shield 200 via the gaps S1 and S2.

The outer member 300 has a shape which surrounds the exterior of the deposition shield 200, and includes an upper outer member 301, middle outer member 302, and lower outer member 303. The upper outer member 301, middle outer member 302, and lower outer member 303 (to be also simply referred to as the "members 301 to 303" hereinafter) are made of a conductive material such as aluminum or stainless steel. The middle outer member 302 and middle deposition shield part 202 correspond to a third member in the present invention, the upper outer member 301 and upper deposition shield part 201 correspond to a second member in the present invention, and the lower outer member 303 and lower deposition shield part 203 correspond to a first member in the present invention.

Of the above-mentioned members, the lower outer member 303 includes a support portion 303a and an annular connecting portion 303b supported by the support portion 303a, as shown in FIG. 2. The lower deposition shield part 203 is detachably attached to the connecting portion 303b by a bolt Bt1, and the connecting portion 303b and lower deposition shield part 203 are electrically connected to each other by surface contact. The lower deposition shield part 203 is also detachably attached to the stage 104 by a bolt Bt2, and the lower deposition shield part 203 and the stage 104 are electrically connected to each other by surface contact. Hence, a current flows from the stage 104 to the lower outer member 303 through the lower deposition shield part 203 during discharge. Note that the support portion 303a and the stage 104 are grounded (see FIG. 1).

The middle outer member 302 includes a roughly cylindrical vertical connecting portion 302a extending in the vertical direction and a horizontal connecting portion 302c extending in the horizontal direction. Also, the middle outer member 302 is connected to a driving shaft 401 so as to be moved in the vertical direction by a driving means such as a cylinder (not shown). When the middle outer member 302 has been moved to the upper position in the vertical direction, the horizontal connecting portion 302c is in contact with the lower surface of the lower outer member 303 (a contact portion D shown in FIG. 2), and the upper end face of the vertical connecting portion 302a is in contact with the upper outer member 301 (a contact portion B shown in FIG. 2), as shown in FIG. 2.

A stepped portion 302b is formed in the upper portion of the vertical connecting portion 302a at a level lower than the upper end face of the vertical connecting portion 302a in the vertical direction. The middle deposition shield part 202 is detachably attached to the middle outer member 302 by a bolt (not shown) so that the middle deposition shield part 202 abuts against the stepped portion 302b. The middle deposition shield part 202 moves as the middle outer member 302 is moved by the driving shaft 401. When the middle deposition shield part 202 has been moved to the upper position in the vertical direction (closed state), the middle deposition shield part 202 forms the above-mentioned noncontact gaps S1 and S2 with lower deposition shield part 203 and the upper deposition shield part 201, respectively, as the remaining deposition shield parts. The inner peripheral surface of the vertical connecting portion 302a need not always be in contact with the outer peripheral surface of the middle outer member 302. It is rather preferable to form a narrow gap between these peripheral surfaces by taking account of, e.g., thermal expansion attributed to heat applied to them during process steps involved.

When the middle deposition shield part 202 has been moved to the upper position in the vertical direction (closed state), as shown in FIG. 2, the current which has flowed from the stage 104 to the lower outer member 303 flows to the middle outer member 302 through the contact portion D during discharge. Also, the current generated due to a change in voltage across the middle deposition shield part 202 and the target electrode 105 flows from the middle deposition shield part 202 to the middle outer member 302.

The upper outer member 301 includes a roughly cylindrical vertical connecting portion 301*a* extending in the vertical direction from the middle outer member 302 toward the side wall (chamber side wall) of the vacuum chamber 103, and a horizontal connecting portion 301*b* extending in the horizontal direction in the upper portion of the vertical connecting portion 301*a*. The horizontal connecting portion 301*b* is detachably attached to the vacuum chamber 103 through a bolt Bt3 by abutting the lower end face of the horizontal connecting portion 301*b* against the stepped portion formed on the side wall of the vacuum chamber 103. Also, the upper deposition shield part 201 is detachably attached to the horizontal connecting portion 301*b* through a bolt Bt4 by abutting the portion, extending in the horizontal direction, of the upper deposition shield part 201 against the upper end face of the horizontal connecting portion 301*b*.

With this arrangement, when the middle deposition shield part 202 is closed, as shown in FIG. 2, the current which has flowed from the stage 104 to the middle outer member 302 flows to the upper outer member 301 through the contact portion D during discharge. Also, the current generated due to a change in voltage across the upper deposition shield part 201 and the target electrode 105 flows from the upper deposition shield part 201 to the upper outer member 301.

The lower deposition shield part 203 is configured by detachably attaching an upper shield plate 203*a* and lower shield plate 203*b* to each other by a bolt Bt5 by vertically stacking them with a narrow gap between them. Slits L1 and L2 are formed in the upper shield plate 203*a* and lower shield plate 203*b*, respectively, at positions offset from each other. The slits L1 and L2 can form a labyrinth-shaped ventilation duct together with the gap between the upper shield plate 203*a* and the lower shield plate 203*b*. The slit L2 formed in the lower shield plate 203*b* runs through the lower outer member 303.

Figure 3:
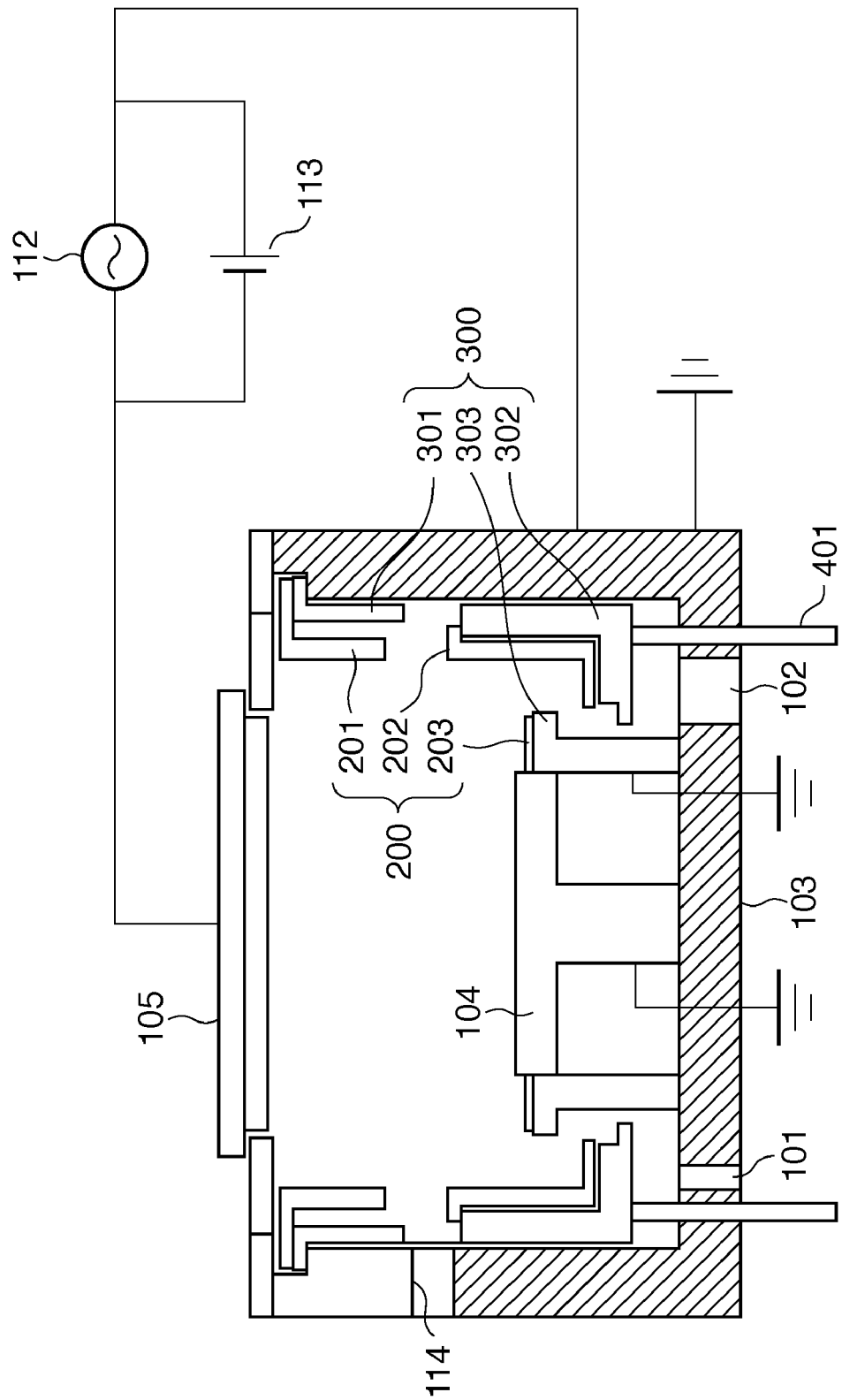
FIG. 3 is a view showing the state (open state) in which a middle deposition shield and middle outer member have been moved to the lower positions in the vertical direction from the state (closed state) shown in FIGS. 1 and 2.

The operation of the sputtering apparatus according to the embodiment will be explained next with reference to FIGS. 1 to 3. FIG. 3 is a view showing the state (open state) in which the middle deposition shield part 202 and middle outer member 302 have been moved to the lower positions in the vertical direction from the state (closed state) shown in FIGS. 1 and 2. In the open state, the middle outer member 302 is spaced apart (separated) from the upper outer member 301 and lower outer member 303.

In the closed state shown in FIG. 1, the middle outer member 302 seals the transport port 114. However, a substrate (not shown) can be transported through the transport port 114 by moving the middle deposition shield part 202 and middle outer member 302 downward in the vertical direction, as shown in FIG. 3. The substrate is transported into the vacuum chamber 103 through the transport port 114 and fixed on the stage 104.

After that, the middle deposition shield part 202 and middle outer member 302 are moved upward in the vertical direction to close the transport port 114. A discharge gas is introduced into the vacuum chamber 103, and then high AC (e.g., 13.56 MHz to 100 MHz) and DC voltages are applied to the target electrode 105 to produce a plasma from the discharge gas. In this way, while the vacuum chamber 103 applied with power from the AC power supply 112 and DC power supply 113 is maintained at a predetermined potential, the driving shaft 401 and the cylinder maintain the upper outer member 301, middle outer member 302, and lower outer member 303 at the positions where the middle outer member 302 comes into contact with the upper outer member 301 and lower outer member 303. Further, the middle outer member 302 and the upper outer member 301 and lower outer member 303 are electrically connected to the vacuum chamber 103.

Hence, currents supplied from the AC power supply 112 and DC power supply 113 flow to the earth upon passing through the stage 104, the outer member 300, and the side wall of the vacuum chamber 103, as described above, through the plasma. The current generated in the deposition shield 200 flows to the earth upon passing through the outer member 300 and the side wall of the vacuum chamber 103. In this manner, since the outer member 300 which does not require replacement forms a return circuit, it is possible to prevent a change in electrical characteristic of the deposition shield 200 attributed to its replacement and, in turn, to stabilize the deposition characteristic of a film formed on the substrate.

In this embodiment, the outer member 300 surrounds the overall exterior of the deposition shield 200 although this feature is not always indispensable for the present invention. With this arrangement, the outer member 300 also functions as a double shield, and this makes it possible to more reliably prevent any plasma leakage. The gaps between the constituent members 301 to 303 of the outer member 300 are preferably set to 0.1 mm (inclusive) to 1 mm (inclusive) because this makes it possible to more effectively prevent any plasma leakage.

Moreover, the conductance can be increased from 20 to 50 L/s corresponding to a conventional single deposition shield to 100 to 200 L/s by forming the slits L1 and L2 at positions offset from each other, as shown in FIG. 2.

Also, this embodiment has exemplified an arrangement which moves the middle deposition shield part 202 and middle outer member 302 throughout the entire circumferential portion of the vacuum chamber 103. With this arrangement, a joint is uniformly formed between the middle deposition shield part 202 and the lower deposition shield part 203 in the circumferential direction of the stage 104. A gap serving as a shield joint is likely to become a singularity in the plasma distribution due to, e.g., entrance of the plasma into the gap and this causes nonuniformity of the plasma distribution. However, it is possible to uniform the plasma distribution and, in turn, to uniform the in-plane distribution of the deposition characteristic by uniformly forming a joint between the middle deposition shield part 202 and the lower deposition shield part 203 in the circumferential direction of the stage 104. Nevertheless, an arrangement which moves the middle deposition shield part 202 and middle outer member 302 throughout the entire circumferential portion of the vacuum chamber 103 is not always indispensable. For example, an arrangement which can vertically move only a portion required to transport a substrate through the transport port 114 may be adopted.

Moreover, the following advantages can be gained by moving the middle deposition shield part 202 and middle outer member 302 to allow substrate transport through the transport port 114, as in this embodiment. That is, an arrangement which moves the middle deposition shield part 202 and middle outer member 302 as in this embodiment obviates the need for a lift mechanism for lifting/lowering the stage 104. If an arrangement which lifts/lowers the stage is adopted, the stage is grounded through a lift mechanism such as a bellows. In contrast, if an arrangement which lifts/lowers the stage is not adopted, grounding through a lift mechanism is unnecessary and this facilitates stabilization of the potential of the stage at the time of grounding. This makes it possible to further stabilize the deposition characteristic.

However, the present invention is not limited to an arrangement which can transport a substrate through the transport port 114 by moving the middle deposition shield part 202 and middle outer member 302. An arrangement which can load a substrate by lifting/lowering the stage 104 using a lift mechanism may be adopted, as shown in FIG. 4. A substrate may be loaded from the transport port 114 into the vacuum chamber 103 when the stage 104 is lowered to the lower end, and the stage 104 may be lifted after the substrate is placed on the stage 104.

Also, although FIG. 1 exemplifies a case in which the stage 104 is located below the target electrode 105, the present invention is not limited to this. An arrangement in which a target electrode is located on the lower side within a vacuum chamber and a stage which holds a substrate is located above the target electrode may be adopted.

Moreover, although this embodiment has exemplified an arrangement in which the middle outer member 302 is connected to the driving shaft 401 and moved by a driving means such as a cylinder (not shown), an arrangement which moves the upper outer member 301 and lower outer member 303 may be adopted instead. Alternatively, an arrangement which independently moves the middle outer member 302 and the upper outer member 301 and lower outer member 303 may be adopted.

Further, the inner portion is not always necessary in the present invention. For example, the present invention may be embodied as the following plasma processing apparatus. The apparatus includes a chamber, a substrate stage for holding a substrate within the chamber, an electrode for generating a plasma inside the chamber, and a conductive shield member formed to surround the plasma space between the electrode and the substrate stage. The shield member includes a first member on the side of the substrate stage, a second member on the side of the chamber, which is spaced apart from the first member, and a third member formed in an annular shape that surrounds the exterior of the substrate stage between the first member and the second member. The third member is formed to be able to connect the chamber and the substrate stage through contact with the first member and the second member. The apparatus further includes a driving means for moving the third member between the closed position and the open position where the plasma space is open. In this case, since the shield member is driven instead of driving the substrate stage, it is possible to stabilize the grounding state of the substrate stage and, in turn, to uniform the in-plane electrical characteristic. In addition, since the contact portions between the third member and the remaining members are uniformed around the substrate periphery, it is possible to uniform the in-plane conditions such as the plasma distribution and the stage potential in this respect as well.

(Application to Electronic Device Manufacturing Method)

The plasma processing apparatus according to the embodiment of the present invention is applicable to a deposition process for manufacturing, for example, an electronic device such as a large-screen flat panel display (liquid crystal display), a thin-film solar battery panel, a microinductor, or a magnetic recording head, or a memory device, which uses a magnetic thin film, such as an MRAM (Magnetoresistive Random Access Memory).

Although a preferred embodiment of the present invention has been described above with reference to the accompanying drawings, the present invention is not limited to this embodiment, and can be changed into various forms within the technical scope understood from the claims.

The invention claimed is:

1. A plasma processing apparatus comprising:
   a chamber;
   a substrate stage configured to hold a substrate within said chamber;
   an electrode configured to generate a plasma inside said chamber; and
   a shield member formed to surround a plasma space between said electrode and said substrate stage,
   wherein said shielding member comprising:
   a main body part; and
   a separated part formed by dividing said main body part,
   wherein said main body part and said separated part each including an inner portion and an outer portion positioned outside said inner portion with respect to the plasma space,
   said outer portions of said main body part and said separated portions are conductive members and are formed to be able to connect said chamber and said substrate stage through contact with each other, and
   said inner portions of said main part and said separated part are formed so as not to be in contact with each other.

2. The plasma processing apparatus according to claim 1, further comprising a driving means for moving said separated part between an open position where the plasma space is open and a contact position where said outer portions of said main part and said separated part come into contact with each other.

3. The plasma processing apparatus according to claim 1, wherein said separated part is formed in an annular shape which surrounds an exterior of said substrate stage.

4. The plasma processing apparatus according to claim 3, wherein said shield member comprises:
   a first member attached to a periphery of said substrate stage;
   a second member which is spaced apart from said first member and serves as said main body part attached to said chamber; and
   a third member which serves as said separated part formed in an annular shape capable of connecting said first member and said second member.

5. The plasma processing apparatus according to claim 1, wherein said inner portions form a labyrinth structure between the plasma space and the contact portion between said outer portions.

6. The plasma processing apparatus according to claim 1, wherein said inner portions are detachably attached to said outer portions.

7. An electronic device manufacturing method comprising a step of manufacturing an electronic device using a plasma processing apparatus defined in claim 1.

* * * * *